United States Patent [19]
Yokota et al.

[11] Patent Number: 5,567,880
[45] Date of Patent: Oct. 22, 1996

[54] SEMICONDUCTOR ACCELEROMETER

[75] Inventors: Yoshihiro Yokota; Shotaro Naito; Toshihiko Suzuki, all of Katsuta; Akira Koide, Chiyoda-machi, all of Japan

[73] Assignee: Hitachi, Ltd., Tokyo, Japan

[21] Appl. No.: 60,832

[22] Filed: May 14, 1993

[30] Foreign Application Priority Data

May 15, 1992 [JP] Japan ................... 4-123220

[51] Int. Cl.⁶ ............................................. G01P 15/08
[52] U.S. Cl. ............................ 73/514.33; 73/514.36
[58] Field of Search ........................ 338/2.5; 73/514.01, 73/514.16, 514.33, 514.35, 514.36

[56] References Cited

U.S. PATENT DOCUMENTS

| | | | |
|---|---|---|---|
| 4,670,092 | 6/1987 | Motamedi | 73/517 R |
| 4,706,374 | 11/1987 | Murakami | 437/225 |
| 4,951,510 | 8/1990 | Holm-Kennedy | 73/517 R |
| 4,987,781 | 1/1991 | Reimann | 73/517 R |
| 5,095,752 | 3/1992 | Suzuki et al. | 73/517 |
| 5,195,371 | 3/1993 | Grieff | 73/503 |
| 5,239,870 | 8/1993 | Kaneko | 73/517 R |
| 5,265,474 | 11/1993 | Chaffin | 73/517 R |

FOREIGN PATENT DOCUMENTS

| | | |
|---|---|---|
| 0369352 | 5/1990 | European Pat. Off. . |
| 0401635 | 12/1990 | European Pat. Off. . |
| 3507820 | 11/1985 | Germany . |
| 1-285863 | 11/1989 | Japan ................... 73/517 AV |
| 3-107767 | 5/1991 | Japan ................... 73/517 R |
| 3-214064 | 9/1991 | Japan ................... 73/517 R |

*Primary Examiner*—Hezron E. Williams
*Assistant Examiner*—Christine K. Oda
*Attorney, Agent, or Firm*—Evenson, McKeown, Edwards & Lenahan, P.L.L.C.

[57] ABSTRACT

A semiconductor accelerometer includes a mass portion formed at a center of a silicon plate, a frame portion formed around the circumference of the silicon plate so as to surround the mass portion and a diaphragm portion formed in the silicon plate between the mass portion and the frame portion so as to bridge the mass portion with the frame portion, one of major surfaces of the silicon plate serving as a common continuous major surface for the mass portion, frame portion and diaphragm portion. Piezoresistance elements are formed on the common continuous major surface at the diaphraqm portion and an additional Au film is formed on the common continuous major surface at the mass portion. The additional Au film constitutes in combination with the mass portion a weight which responds to an acceleration acting thereon. The mass of the additional Au film is selected in such a manner that the center of gravity of the weight is located within an area in the mass portion having a depth corresponding to the thickness of the diaphragm portion.

5 Claims, 9 Drawing Sheets

SEMICONDUCTOR ACCELEROMETER

BACKGROUND OF THE INVENTION

1. Field of the Invention

The present invention relates to a semiconductor accelerometer and, in particular, relates to a semiconductor accelerometer suitable such as for actuating an air bag in a motor vehicle and for controlling a motor vehicle.

2. Description of Related Art

Figure 17:
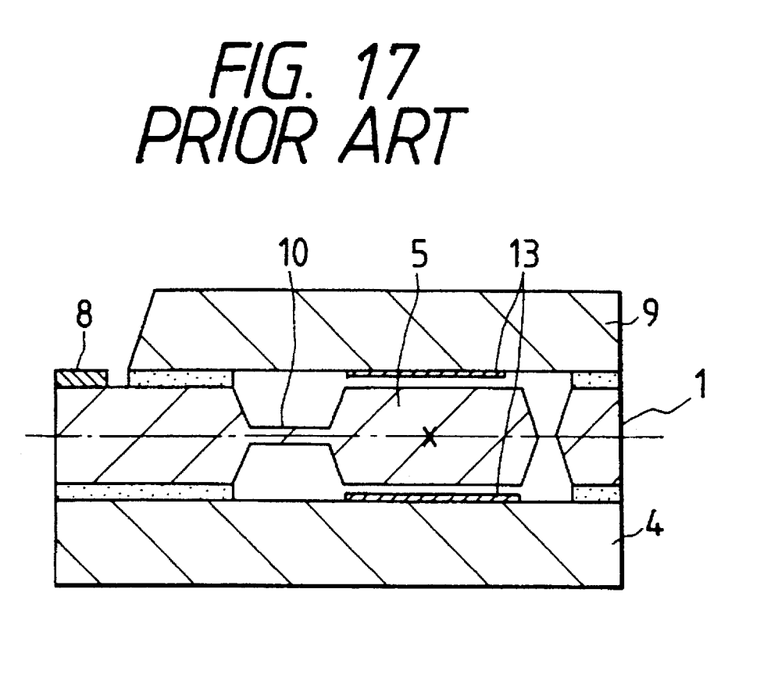
FIG. 17 is a cross sectional view of a conventional capacitance type semiconductor accelerometer according to the prior art.

FIG. 17 illustrates one example of a capacitance type semiconductor accelerometer as disclosed in U.S. Pat. No. 5,095,752 wherein a weight 5 for sensing an acceleration is formed in a silicon plate 1 by etching while being supported by a cantilever portion 10 connected to the outer frame portion of the silicon plate 1. The silicon plate 1 is sandwiched between glass plates 4 and 9 via a bonding material. Stationary electrodes 13 are formed on the respective surfaces facing the two major surfaces of the weight 5 which serves as a movable electrode in response to acceleration acting thereon and a capacitance change caused thereby is transmitted to a signal processing unit (not shown) through bonding pads 8.

In the above capacitance type semiconductor accelerometer, the center of gravity indicated by an asterisk on the weight 5 is designed to be located on a parallel plane containing a center line in the thickness direction of the cantilever portion 10.

JP-3-214064(1991) also discloses a semiconductor accelerometer using piezo resistances for detecting an acceleration having a similar weight configuration as the above.

In the above conventional art, the mass portion constituting the weight for sensing an acceleration was formed by processing the silicon plate itself, and a microscopic processing which uses a double side alignment of several times was. Therefore it was difficult to manufacture such semiconductor accelerometers with a sufficient processing accuracy. For this reason, a mass-production of such semiconductor accelerometers was difficult.

SUMMARY OF THE INVENTION

An object of the present invention is to provide a semiconductor accelerometer which permits mass-production with a satisfactory processing accuracy and is designed to detect accelerations ranging from a small acceleration necessary for a motor vehicle body control up to an acceleration of about 100 G.

The above object of the present invention is achieved by a semiconductor accelerometer having a frame portion which is to be secured on an object for detection, a mass portion which converts an acceleration of the object for detection into an inertia force and a diaphragm portion which bridges between the frame portion and the mass portion wherein a metal film for providing an additional mass is formed on at least one surface of the mass portion.

Further, the above object of the present invention is achieved by a semiconductor accelerometer having a frame portion which is to be secured on an object for detection, a mass portion which converts an acceleration of the object for detection into an inertia force and a diaphragm portion which bridges between the frame portion and the mass portion wherein a metal film for providing an additional mass is formed on both the upper and lower surfaces of the mass portion.

Still further, the above object of the present invention is achieved by a semiconductor accelerometer having a frame portion which is to be secured on an object for detection, a mass portion which converts an acceleration of the object for detection into an inertia force and a diaphragm portion which bridges between the frame portion and the mass portion wherein an additional mass having a higher density than that of the mass portion is provided on at least one surface of the mass portion.

The above object of the present invention is achieved by a semiconductor accelerometer having a frame portion which is to be secured on an object for detection, a mass portion which converts an acceleration of the object for detection into an inertia force and a diaphragm portion which bridges between the frame portion and the mass portion wherein an additional mass is disposed on at least one surface of the mass portion in such a manner that the center of gravity of the weight constituted by the mass portion and the additional mass locates on a parallel plane containing a center line in the thickness direction of the diaphragm portion.

With the present invention the weight for sensing an acceleration is constituted by a combination of the mass portion formed by deep etching the silicon plate and an additional mass formed on the mass portion. The conventional microscopic processing which requires double side alignment of several times is eliminated, thereby a semiconductor accelerometer having a high processing accuracy is obtained. Further, the density and the configuration of the additional mass formed on the mass portion is selected such that the center of gravity of the weight constituted by the mass portion and the additional mass locates on a parallel plane containing a center line in the thickness direction of the diaphragm portion. Thereby the zero point compensation of outputs from the resultant semiconductor accelerometer according to the present invention is facilitated.

DETAILED DESCRIPTION OF THE EMBODIMENTS

A first embodiment of piezoresistance type semiconductor accelerometers according to the present invention is explained with reference to FIGS. 1 and 2.

A mass portion 5, a frame portion 3 and a diaphragm portion 6 bridging between the mass portion 5 and the frame portion 3 for a piezoresistance type semiconductor accelerometer is formed from a single crystalline silicon plate 1 by deep etching the same. The movement of the mass portion 5 in response to an acceleration is balanced in combination with the length and thickness of the diaphragm portion 6. Further, the balancing is controlled via combination of the mass portion 5 and an additional metal film 7 formed on the mass portion 5 in the present embodiment. Piezoresistance elements 21, 22, 23 and 24 are formed at predetermined positions on one major surface of the diaphragm portion 6.

In a conventional capacitance type semiconductor accelerometer as illustrated in FIG. 17, the mass portion 5 is shaped in such a manner that the center of the gravity of the mass portion as shown by an asterisk is positioned on a parallel plane containing the center in the thickness direction of the cantilever 10, in other words, the center line of the mass portion 5 in the thickness direction thereof aligns with that of the cantilever 10 in its thickness direction in order to maintain a linearity or hysteresis and sensitivity of outputs of the semiconductor accelerometer within predetermined levels.

However, the configuration of the mass portion 5 as shown in FIG. 17 required double side alignment of 4~5 times for performing photolithographic process on a semiconductor wafer. This is a very complex microscopic process and makes it very difficult to maintain a predetermined dimensional accuracy at both sides of the wafer.

Further, although single side aligners of the stepper type are commonly used for manufacturing semiconductors such as ultra large scale integration, no double side aligners of the stepper type exist. Therefore, a double side aligner of the contact type, which is unsuitable for massproduction such as to form hundreds of chips on a single wafer, has to be used for the production of the semiconductor accelerometers having the above configuration. This requires a highly accurate pattern matching of several times on both the front and back sides of the wafer.

Unlike power semiconductors such as GTO thyristors, which are configured via a double side exposure on a wafer constituting a single chip by making use of a contact type double side aligner, several hundreds of semiconductor sensors such as semiconductor accelerometers having a three dimensional configuration have to be formed in a form of chips on a single wafer. Therefore, the double side aligner and the process used for producing the power semiconductors can hardly be utilized for producing the semiconductor sensors. Moreover, incident angles and aberration of an exposure light on a chip at the center of the wafer and a chip at the edge portion of the wafer vary significantly and accuracy of the exposed pattern on respective chips are exponentially deteriorated through many times of the double side alignment operations which prevents massproduction of the semiconductor accelerometers having a configration requiring a plurality of double side alignment operations.

Figure 1:
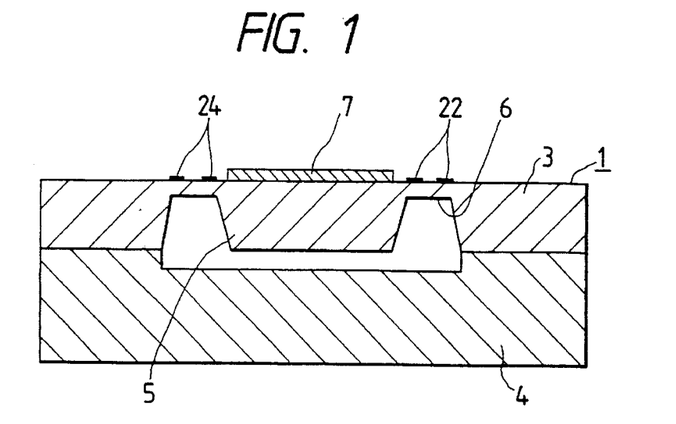
FIG. 1 is a cross sectional view showing a first embodiment of piezoresistance type semiconductor accelerometers according to the present invention.

However, the shaping of the silicon plate 1 as shown in FIG. 1 is carried out with a double side alignment of only once like conventional semiconductor pressure sensors which are nowadays massproduced. Further, a deep etching process from one side of the wafer is also required only once to complete the configuration. Further, in order to maintain predetermined sensor characteristics such as linearity of output and sensitivity, the additional metal film 7, which is made of materials such as Au (gold) and has a corresponding weight to that of the mass portion 5 formed by deep etching, is formed on the mass portion 5 in such a manner that the center of gravity of the weight from the combination of the mass portion 5 and the additional metal film 7 is located on a parallel plane containing a center line of the diaphragm portion 6 in the thickness direction.

The silicon plate 1 thus configured is bonded on a lower side glass plate 4, such as by anodic bonding so as to facilitate mounting of the semiconductor accelerometer.

Figure 2:
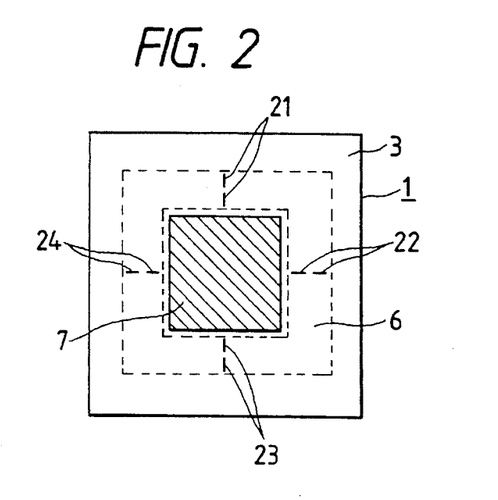
FIG. 2 is a plane view of the semiconductor accelerometer shown in FIG. 1.

When one chip size of the semiconductor accelerometer, such as shown in FIG. 2, is reduced to a few mm square, such as 3 mm$^2$, to have a limited weight of the mass portion, the thickness, for example, of the diaphram portion 6 has to be reduced so that the limited weight can respond to acceleration. However, the thickness of the diaphragm portion 6 cannot be reduced below a predetermined thickness for maintaining mechanical strength.

Figure 3:
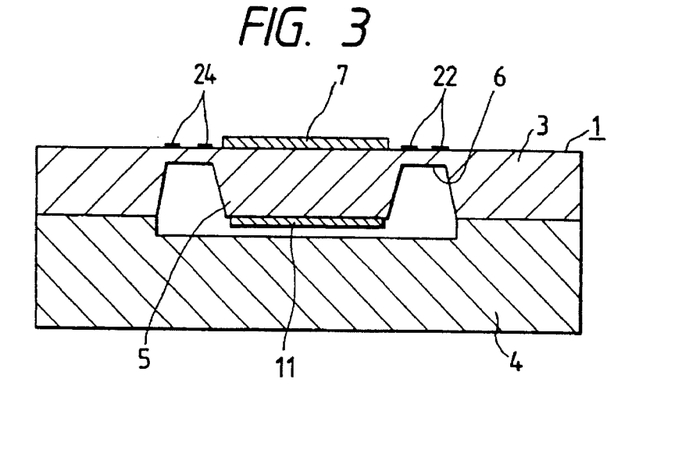
FIG. 3 is a cross sectional view showing a second embodiment of piezoresistance type semiconductor accelerometers according to the present invention.

FIG. 3 shows a second embodiment of piezoresistance type semiconductor accelerometers according to the present invention which eliminates the necessity of thickness reduction of the diaphragm portion 6 as explained above wherein the same or equivalent elements as in the FIG. 1 and FIG. 2 embodiment are designated by the same reference numbers. In the FIG. 3 embodiment, a second additional metal film 11 is formed on the back side of the mass portion 5 and the thickness of the first additional metal film 7 is determined to counter-balance the combined weight of the mass portion 5 and the second additional metal film 11.

Figure 4:
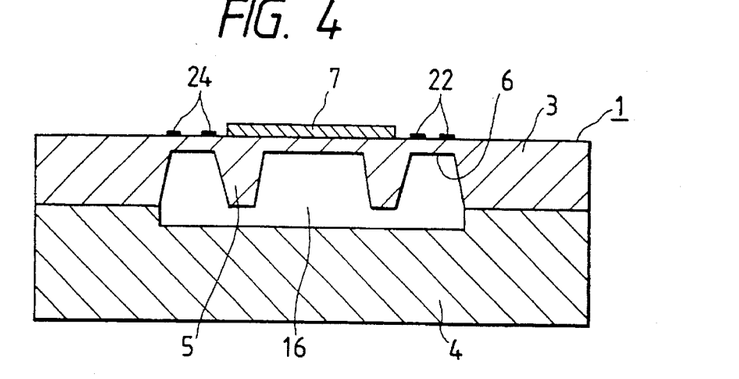
FIG. 4 is a cross sectional view showing a third embodiment of piezoresistance type semiconductor accelerometers according to the present invention.

FIG. 4 shows a third embodiment of piezoresistance type semiconductor accelerometers according to the present invention wherein the same or equivalent elements as in the FIG. 1 and FIG. 2 embodiment are designated by the same reference numerals. In the FIG. 4 embodiment, a recess 16 is provided at the back face of the mass portion 5 for adjusting the weight and balance formed from the combination of the mass portion 5 and the first additional metal film 7.

Figure 5:
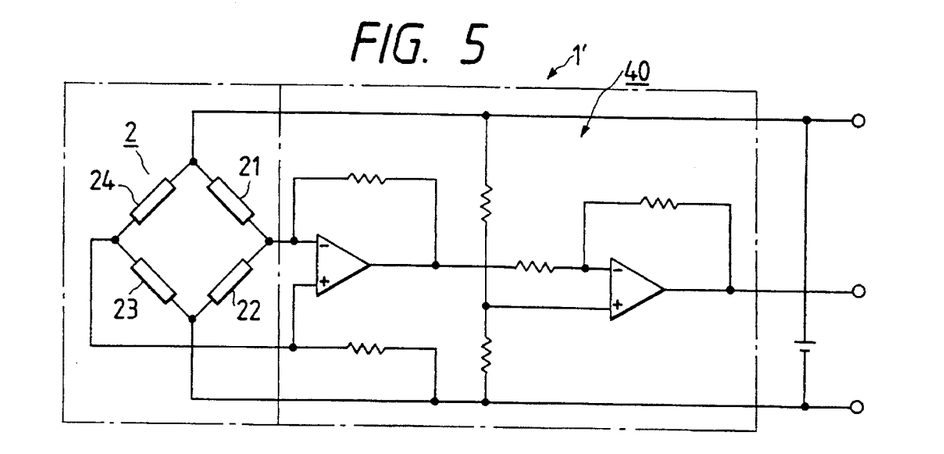
FIG. 5 is a circuit diagram applied to the semiconductor accelerometers shown in FIG. 1, FIG. 3 and FIG. 4 for processing signals from a bridge circuit of piezoresistance elements formed on the semiconductor accelerometer.

FIG. 5 is a circuit diagram including a bridge circuit 2 constituted by piezoresistance or diffusion type train gauges 21, 22, 23 and 24 formed on the diaphragm portion 6 of the semiconductor accelerometer such as is shown in FIG. 1 through FIG. 4, and a signal processing circuit 40 for signals from the bridge circuit.

Figure 6A:
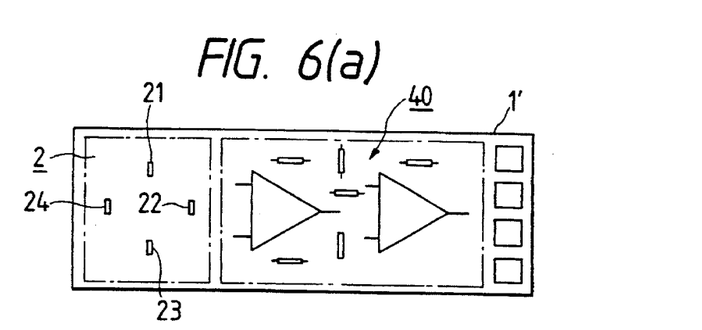
FIG. 6(a) is a plane view illustrating a schematic layout of the circuit elements shown in FIG. 5 on one semiconductor substrate.

FIG. 6(a) is a plane view illustrating a layout of the circuit elements shown in FIG. 5 formed on a common semiconductor substrate 1, for the semiconductor accelerometer such as is shown in FIG. 1 through FIG. 4 and for the signal processing circuit 40 for processing the signals from the bridge circuit 2 formed on the semiconductor accelerometer portion.

Figure 6B:
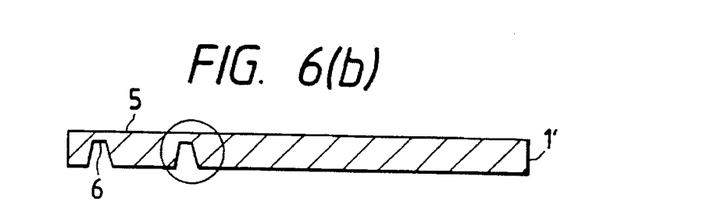
FIG. 6(b) is a cross sectional view of the semiconductor substrate shown in FIG. 6(a)

FIG. 6(b) is a cross sectional view of the integrated semiconductor body shown in FIG. 6(a).

Figure 7:
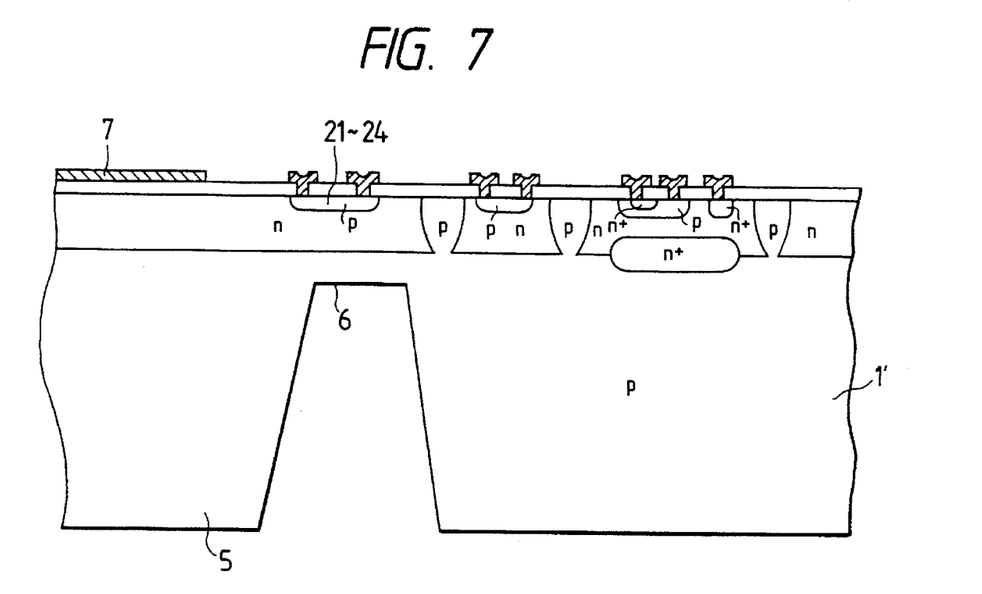
FIG. 7 is an enlarged cross sectional view of the encircled portion in FIG. 6(b)

FIG. 7 is an enlarged and detailed cross sectional view of the encircled portion in FIG. 6(b) wherein in addition to the piezoresistances 21 through 24, a parallel resistance for an amplifier and an npn transistor for the amplifier in the signal processing circuit 40 are illustrated.

Figure 8:
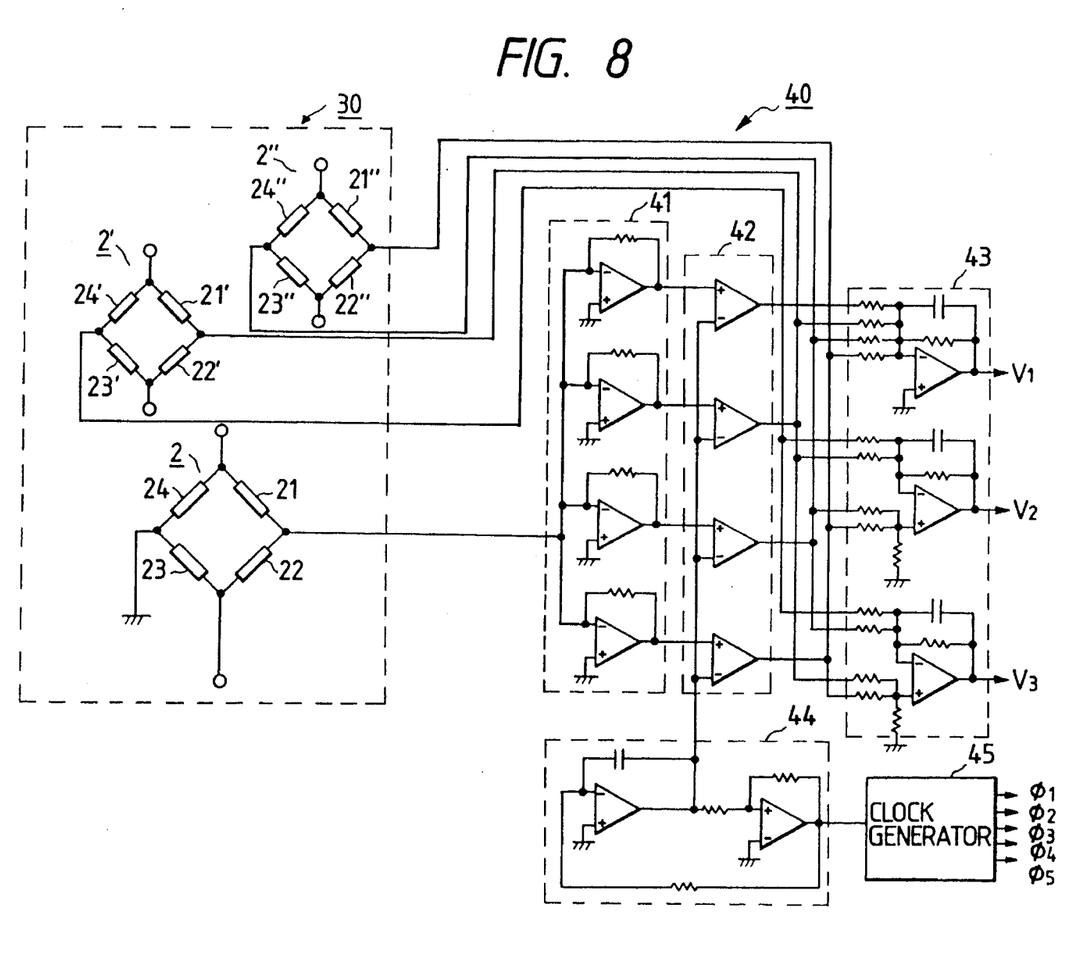
FIG. 8 is a circuit diagram for processing signals from three sets of semiconductor accelerometers shown in one of FIGS. 1, 3 and 4 for determining three dimensional acceleration.

FIG. 8 is a circuit diagram for determining three dimensional accelerations $V_1$, $V_2$ and $V_3$ in x, y and z directions by making use of three sets of bridge circuits 2, 2' and 2" which constitute a detection unit 30. The signal processing circuit 40 is of a conventional type which includes an amplifying unit 41, a PWM unit 42, a processing and outputting unit 43, an oscillator 44 and a clock generator 45 which generates clock signals $\Phi_1$ through $\Phi_5$ for phase shifting the detection signals from the respective bridge circuits 2, 2' and 2".

Figure 9:
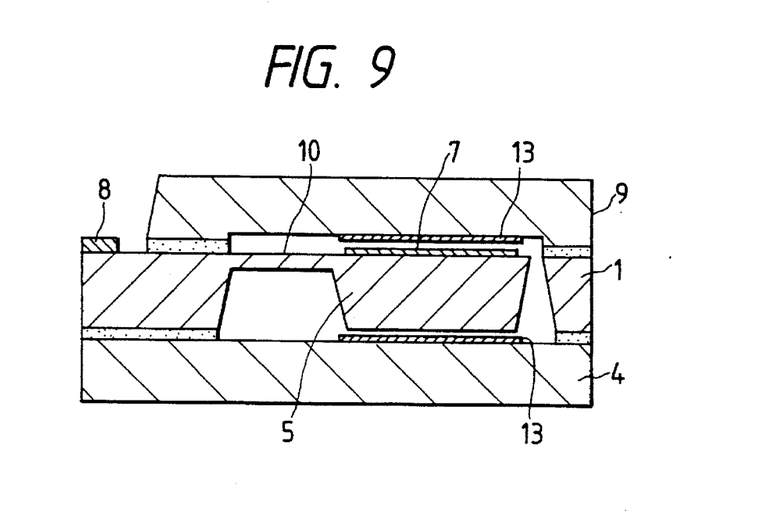
FIG. 9 is a cross sectional view showing a first embodiment of capacitance type semiconductor accelerometers according to the present invention.

FIG. 9 is a first embodiment of capacitance type semiconductor accelerometers according to the present invention wherein the same or equivalent elements as those shown in FIG. 17 are designated by the same reference numerals. In the FIG. 9 embodiment, the mass portion 5 is formed by deep etching the silicon plate 1 from one side and the additional metal film 7 is formed on the other side of the mass portion 5 in the same manner as in the embodiment shown in FIG. 1 and FIG. 2. Therefore, the microscropic processing for configurating the silicon plate 1 is facilitated.

Figure 10:
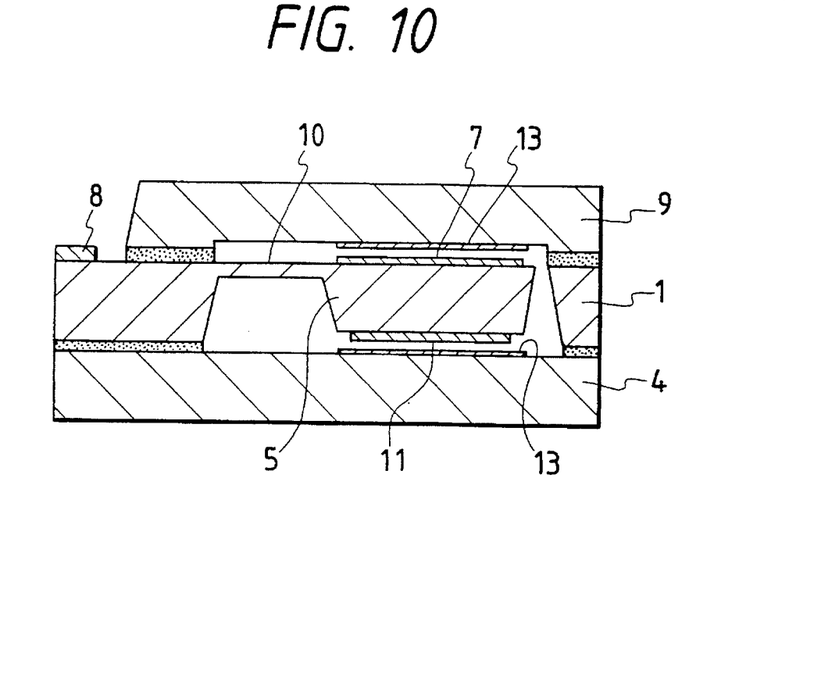
FIG. 10 is a cross sectional view showing a second embodiment of capacitance type semiconductor accelerometers according to the present invention.

FIG. 10 is a second embodiment of capacitance type semiconductor accelerometers according to the present invention wherein the same or equivalent elements as those shown in FIG. 17 are designated by the same reference numerals. In the FIG. 10 embodiment, the second additional metal film 11 is provided on the back face of the mass portion 5 in addition to the first additional metal film 7 in the same manner as in the embodiment shown in FIG. 3.

Figure 11:
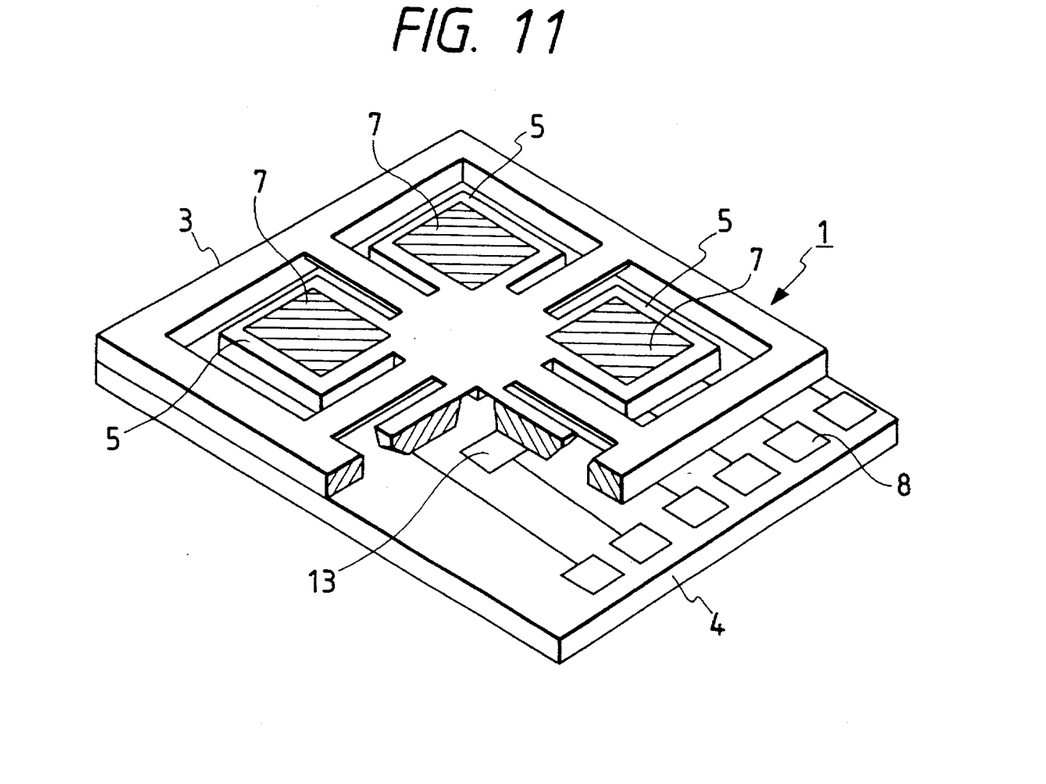
FIG. 11 is a perspective view showing a third embodiment of capacitance type semiconductor accelerometers for detecting a three dimensional acceleration, and being formed integrally according to the present invention.

FIG. 11 is a partially broken perspective view of a third embodiment of capacitance type semiconductor accelerometers which includes four semiconductor accelerometer units formed integrally for detecting three dimensional acceleration wherein the same and equivalent elements as in FIG. 9 are designated by the same reference numerals and the upper glass plate 9 is removed for the sake of clear illustration of the structure.

Figure 12:
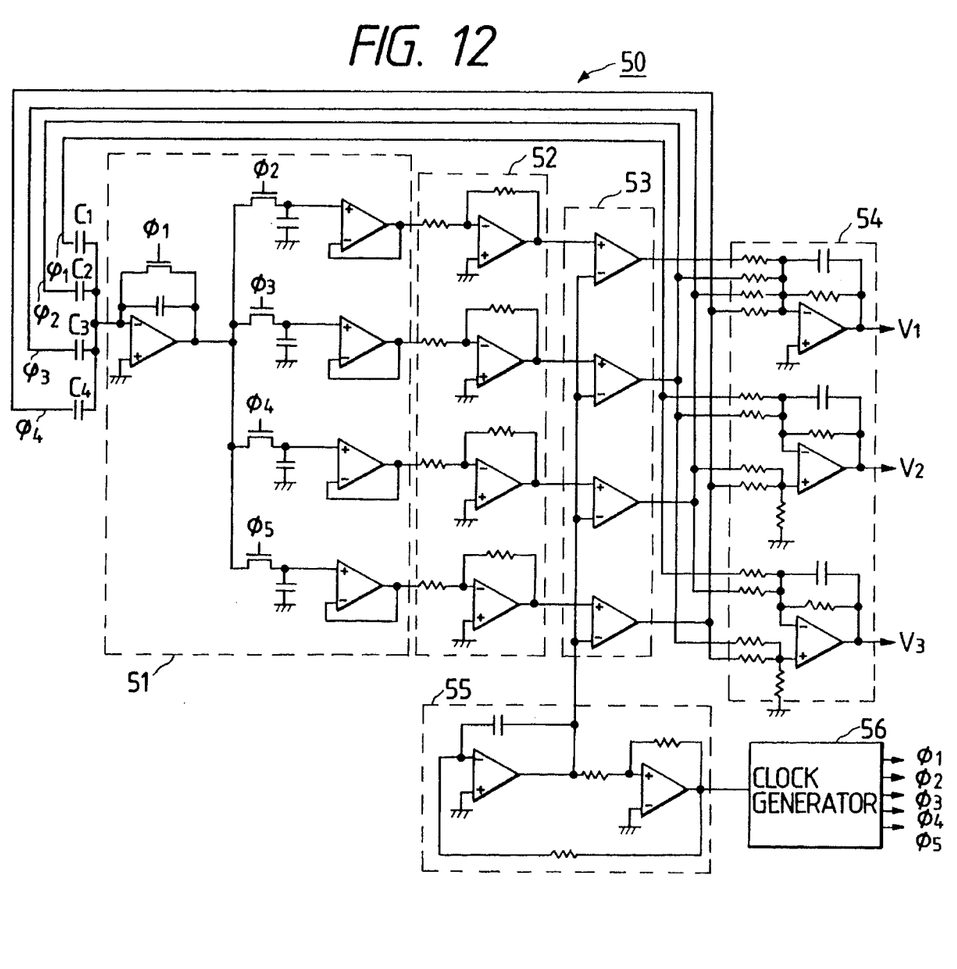
FIG. 12 is a circuit diagram for processing signals from the capacitance type semiconductor accelerometer shown in FIG. 11 for determining three dimensional acceleration.

FIG. 12 is a signal processing circuit 50 of the signals $\phi_1$ through $\phi_4$ from the capacitance type semiconductor accelerometer shown in FIG. 11 having four semiconductor accelerometer units $C_1$, $C_2$, $C_3$ and $C_4$ for determining three dimensional accelerations $V_1$, $V_2$ and $V_3$ in x, y and z directions. The signal processing circuit 50 is of a conventional type which includes a $\Delta C$ detection unit 51, an amplifying unit 52, a PWM unit 53, a processing and outputting unit 54, an oscillator 55 and a clock generator which generates clock signals $\Phi_1$ through $\Phi_5$ for phase shifting the detection signals $\phi_1$ through $\phi_4$ from the respective semiconductor accelerometer units $C_1$ through $C_4$.

Figure 13:
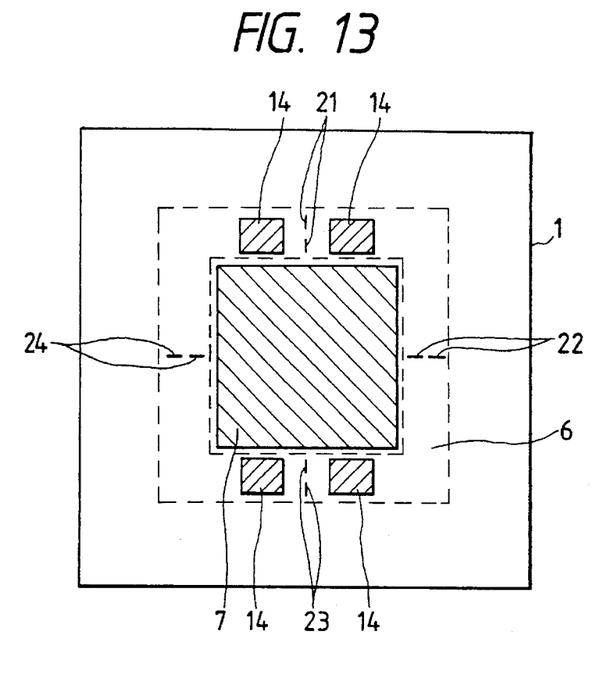
FIG. 13 is a plane view showing a fourth embodiment of piezoresistance type semiconductor accelerometers according to the present invention.

FIG. 13 is a plane view of fourth embodiment of piezoresistance type semiconductor accelerometers according to the present invention wherein the same or equivalent elements as in FIG. 1 and FIG. 2 are designated by the same numerals. In the FIG. 13 embodiment, a pair of communicating holes 14 are provided on the diaphragm portion 6 at both sides of the diffusion type strain gauges 21 and 23 for permitting communication between the upper and lower spaces separated by the diaphragm 6 and the mass portion 5 so as to improve movement of the weight formed from the combination of the mass portion 5 and the additional metal film 7 in response to accelerations acting thereon.

The location and the configuration of the communication holes 14 are not limited to that illustrated in FIG. 13, but any locations and configurations can be taken if such does not disturb a balanced movement of the weight in response to accelerations acting thereon.

Figure 14:
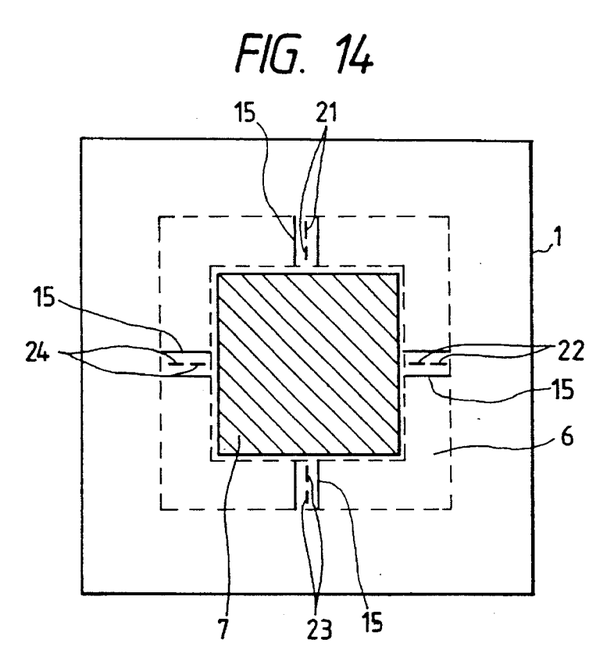
FIG. 14 is a plane view showing a fifth embodiment of piezoresistance type semiconductor accelerometers according to the present invention.

FIG. 14 shows a plane view of a fifth embodiment of piezoresistance type semiconductor accelerometers according to the present invention wherein the same or equivalent elements as in FIGS. 1 and 2 are designated by the same numerals. In the FIG. 14 embodiments reenforcing portions 15 having an increased thickness are provided across the diaphragm portion 6 at the positions where the diffusion type strain gauges 21 through 24 are formed, thereby the mechanical strength of the diaphragm portion 6 is reenforced in case the thickness of the diaphragm portion 6 is reduced.

Figures 15, 15A:
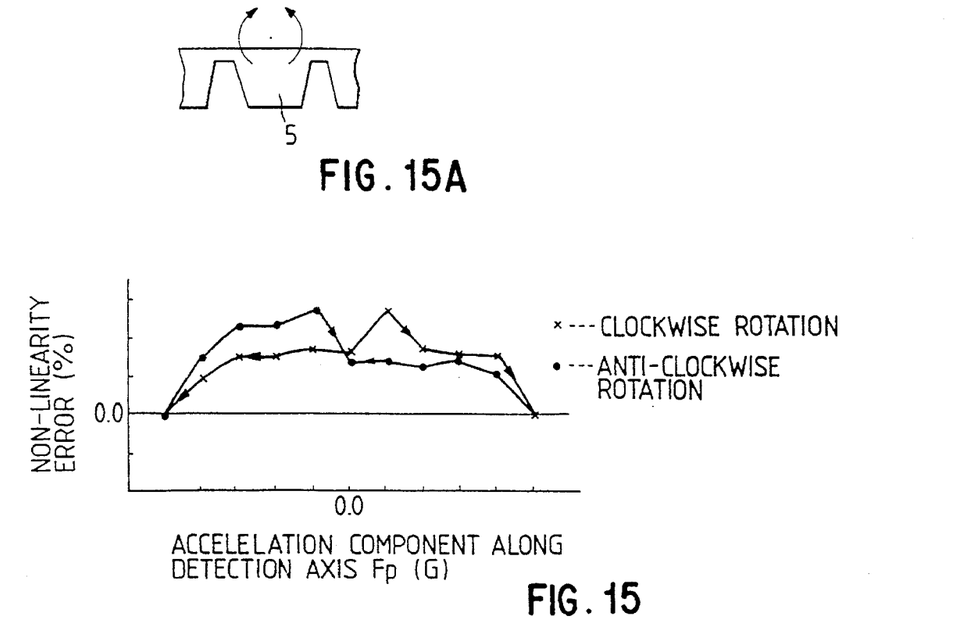
FIG. 15 is a graph showing the non-linearity error of a semiconductor accelerometer without a mass center adjusting measure with respect to variation of acceleration component along the detection axis.
Figure 16:
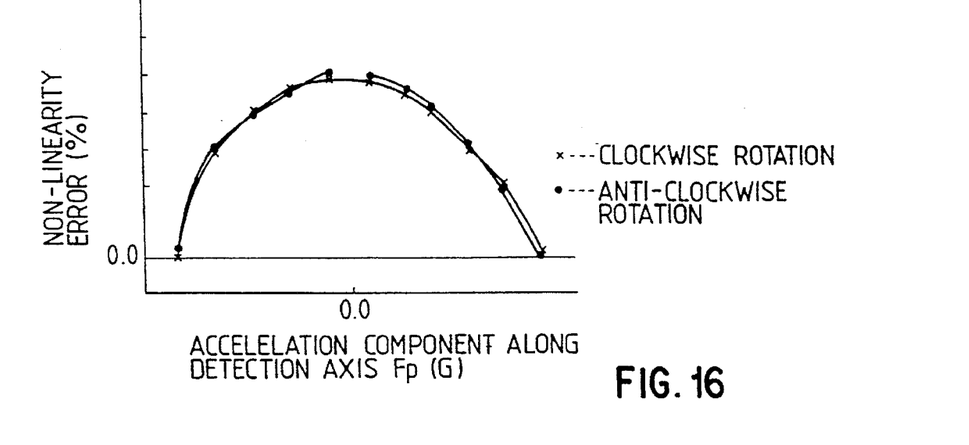
FIG. 16 is a graph showing the non-linearity error of a semiconductor accelerometer with a mass center adjusting measure according to the present invention with respect to variation of an acceleration component along the detection axis.
Figure 16A:
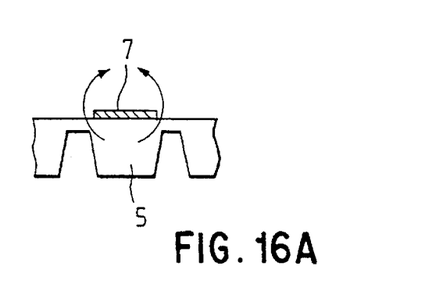

FIG. 15 and FIG. 16 are graphs for explaining an improvement of non-linearity errors with the present invention.

FIG. 15 shows a non-linearity error of a semiconductor accelerometer with no additional metal film as schematically illustrated in the graph when the schematically illustrated semiconductor accelerometer is rotated in clockwise direction then returned in anti-clockwise direction as indicated by arrows so as to vary acceleration components Fp(G) in the detection axis. As seen from the graph a comparatively large non-linearity error is observed.

FIG. 16 shows a non-linearity error of a semiconductor accelerometer with an additional metal film 7 according to the present invent ion as schematically illustrated in the graph when the schematically illustrated semiconductor accelerometer is rotated in clockwise direction then returned in anti-clockwise direction as indicated by arrows so as to vary acceleration components Fp(G) in the detection axis. As seen from the graph, the non-linearity error is substantially eliminated.

In the embodiments shown in FIG. 9, FIG. 10 and FIG. 11, the upper and lower glass plates 4 and 9 are used, however the glass plates 4 and 9 can be replaced with silicon plates.

According to the semiconductor accelerometer hitherto explained, zero point adjustment of the detection signals output therefrom can be performed simply and acceleration detection accuracy is enhanced, since the center of gravity of the weight formed from the combination of the mass portion and the additional metal film can be designed to locate in an area of the mass portion defined by an extension of the diaphragm portion or cantilever portion and having a depth corresponding to the thickness of the diaphragm portion or cantilever portion.

Since the semiconductor accelerometers according to the present invention can detect acceleration ranging from a small acceleration which is used for a motor vehicle body control to an acceleration of about 100 G, the semiconductor accelerometers according to the present invention can be combined with an air bag control system as well as a vehicle body control system in a motor vehicle with a high accuracy.

According to the present invention, semiconductor accelerometers having small non-linearity output and a high sensitivity which are suitable for massproduction is obtained.

We claim:

1. A semiconductor accelerometer comprising:

a mass portion formed at a center of a silicon plate having two major surfaces;

a frame portion formed around the circumference of the silicon plate so as to surround said mass portion;

a diaphragm portion formed in the silicon plate between said mass portion and said frame portion so as to bridge said mass portion with said frame portion, one of said two major surfaces of the silicon plate serving as a common planar major surface for said mass portion, said frame portion and said diaphragm portion;

piezoresistance elements formed on the common planar major surface at said diaphragm portion;

an additional metal film having a higher density than that of the silicon plate formed on the common planar major surface at said mass portion; and a further additional metal film having a higher density than that of the silicon plate formed on said mass portion on the other of said two major surfaces of said silicon plate, said additional metal film and said further additional metal film constituting in combination with said mass portion of the silicon plate a weight which responds to an acceleration acting thereon, and the mass of said additional metal film and said further additional film being selected in such a manner that the center of gravity of the weight is located within an area in said mass portion having a depth corresponding to the thickness of said diaphragm portion and defined by an extension of said diaphragm portion.

2. A semiconductor accelerometer according to claim 1, wherein said additional metal film is made of Au.

3. A semiconductor accelerometer according to claim 1, further comprising:

a plurality of communicating holes formed at said diaphragm portion, said communicating holes extending between spaces separated by said diaphragm portion and said mass portion.

4. A semiconductor accelerometer according to claim 1, wherein said diaphragm portion where the piezoresistance elements are formed is reinforced by increasing the thickness of said diaphragm portion.

5. A semiconductor accelerometer comprising:

a mass portion formed at a center of a silicon plate having two major surfaces;

a frame portion formed around the circumference of the silicon plate so as to surround said mass portion;

a supporting portion formed in the silicon plate between said mass portion and said frame portion so as to bridge said mass portion with said frame portion, one of said two major surfaces of said silicon plate serving as a common planar major surface for said mass portion, said frame portion and said supporting portion;

an additional metal film having a higher density than that of the silicon plate formed on the common planar major surface at said mass portion; and a further additional metal film having a higher density than that of the silicon plate formed on said mass portion on the other of said two major surfaces of said silicon plate, said additional metal film and said further additional metal film constituting in combination with said mass portion of the silicon plate a weight which responds to an acceleration acting thereon, and the mass of said additional metal film and said further additional metal film being selected in such a manner that the center of gravity of the weight is located within an area in said mass portion having a depth corresponding to the thickness of said supporting portion and defined by an extension of said supporting portion.

* * * * *